(12) United States Patent
Esseghir et al.

(10) Patent No.: US 8,991,039 B2
(45) Date of Patent: Mar. 31, 2015

(54) METHOD FOR MANUFACTURING FLEXIBLE MULTILAYER ELECTRICAL ARTICLES WITH IMPROVED LAYER ADHESION

(75) Inventors: Mohamed Esseghir, Monroe Township, NJ (US); Jeffrey M. Cogen, Flemington, NJ (US); Saurav S. Sengupta, Franklin Park, NJ (US)

(73) Assignee: Dow Global Technologies LLC, Midland, MI (US)

( * ) Notice: Subject to any disclaimer, the term of this patent is extended or adjusted under 35 U.S.C. 154(b) by 204 days.

(21) Appl. No.: 13/822,083

(22) PCT Filed: Sep. 21, 2011

(86) PCT No.: PCT/US2011/052457
§ 371 (c)(1),
(2), (4) Date: Mar. 11, 2013

(87) PCT Pub. No.: WO2012/044499
PCT Pub. Date: Apr. 5, 2012

(65) Prior Publication Data
US 2013/0174416 A1    Jul. 11, 2013

Related U.S. Application Data

(60) Provisional application No. 61/388,467, filed on Sep. 30, 2010.

(51) Int. Cl.
*H05K 3/36* (2006.01)
*H05K 3/46* (2006.01)
*B29C 45/14* (2006.01)
*B29K 23/00* (2006.01)

(52) U.S. Cl.
CPC ........ *H05K 3/4644* (2013.01); *B29C 45/14311* (2013.01); *B29C 45/14467* (2013.01); *B29C 45/14639* (2013.01); *B29C 45/14778* (2013.01); *B29C 2045/14532* (2013.01); *B29K 2023/00* (2013.01); *B29K 2023/083* (2013.01); *B29K 2023/16* (2013.01); *B29K 2995/0007* (2013.01)
USPC ................. 29/830; 29/846; 29/852

(58) Field of Classification Search
USPC .......................... 29/830, 846, 852
See application file for complete search history.

(56) References Cited

U.S. PATENT DOCUMENTS

| | | | |
|---|---|---|---|
| 5,064,802 A | 11/1991 | Stevens et al. | |
| 5,272,236 A | 12/1993 | Lai et al. | |
| 5,278,272 A | 1/1994 | Lai et al. | |
| 5,986,028 A | 11/1999 | Lai et al. | |
| 6,290,892 B1 | 9/2001 | Tsai et al. | |
| 6,380,294 B1 * | 4/2002 | Babinec et al. | 524/440 |
| 6,796,820 B2 | 9/2004 | Jazowski et al. | |
| 6,905,356 B2 | 6/2005 | Jazowski et al. | |
| 6,955,848 B2 * | 10/2005 | Wakizaka et al. | 428/209 |
| 7,611,747 B2 * | 11/2009 | Onishi et al. | 427/97.6 |
| 2003/0134538 A1 | 7/2003 | Bolcar | |
| 2003/0228779 A1 | 12/2003 | Jazowski et al. | |
| 2010/0000600 A1 | 1/2010 | Hoya | |

FOREIGN PATENT DOCUMENTS

| | | |
|---|---|---|
| EP | 0920967 A1 | 6/1999 |
| EP | 1441046 A1 | 7/2004 |
| JP | 2000153587 A | 6/2000 |
| JP | 2002015626 A | 1/2002 |
| JP | 2004255802 A | 9/2004 |
| JP | 2006321119 A | 11/2006 |
| WO | 93/19104 A1 | 9/1993 |
| WO | 95/00526 A1 | 1/1995 |
| WO | 95/14024 A1 | 5/1995 |
| WO | 98/49212 A1 | 11/1998 |
| WO | 01/92007 A2 | 12/2001 |
| WO | 2004/040730 A1 | 5/2004 |
| WO | 2007032885 A2 | 3/2007 |
| WO | 2007/068695 A1 | 6/2007 |
| WO | 2008/015984 A1 | 2/2008 |

* cited by examiner

*Primary Examiner* — Carl Arbes
(74) *Attorney, Agent, or Firm* — Whyte Hirschboeck Dudek S.C.

(57) ABSTRACT

A process for manufacturing a multilayer article, the article comprising two crosslinked semiconductive layers separated by and bonded to an insulation layer, the semiconductive layers formed from a peroxide-crosslinkable olefin elastomer and the insulation layer comprising composition comprising a silane-grafted olefinic elastomer, the process comprises the steps of: (A) injecting the silane-grafted olefinic elastomer between the two crosslinked semiconductive layers so as to have direct contact with each semiconductive layer, and (B) crosslinking the silane-grafted olefinic elastomer in the absence of a peroxide catalyst.

10 Claims, No Drawings

METHOD FOR MANUFACTURING FLEXIBLE MULTILAYER ELECTRICAL ARTICLES WITH IMPROVED LAYER ADHESION

CROSS REFERENCE TO RELATED APPLICATION

The present application is the national phase of PCT Patent Application No. PCT/US2011/052457 filed Sep. 21, 2011, which claims priority to U.S. provisional application Ser. No. 61/388,467 filed on Sep. 30, 2010, the entire content of which is incorporated by reference herein.

BACKGROUND OF THE INVENTION

1. Field of the Invention

This invention relates to a method of manufacturing a multilayer molded article for electrical applications comprising an inner semiconductive layer, an electrically insulating layer, and an outer semiconductive layer. In one aspect, the process includes first crosslinking the semiconductive layers individually, and then injecting an insulation resin between the crosslinked semiconductive layers. In one aspect, the invention relates to a process in which the insulation layer is crosslinked using an organopolysiloxane containing two or more functional end groups so as to adhere it to one or more of the crosslinked semiconductive layers.

2. Description of the Related Art

For high temperature resistance, multilayered molded articles, which are generally made from elastomeric materials, are crosslinked. The dominant materials currently used in the industry include peroxide crosslinkable compounds based on ethylene-propylene-diene monomer (EPDM) or silicone rubbers. The multilayered molded articles are manufactured via multiple-step injection molding using in-mold vulcanization at high temperature. Additional post-molding cure in a high temperature autoclave is also used. Co-extrusion of the tubular portion of these parts is also practiced in the industry. The semiconductive and insulation layers are bonded together during a high temperature manufacturing step. Layer bonding is achieved via interfacial crosslinking using the peroxide present in the adjoining layers. Layer bonding is very important to prevent inter-layer dislocation during installation or loss of insulation performance (e.g. air voids or gaps) at the interface which is a region of high electrical stress which can lead to part failure.

SUMMARY OF THE INVENTION

In one embodiment the invention is a process for manufacturing a multilayer electrical article, the article comprising two semiconductive layers separated and joined by an insulation layer, the process comprising the step of injecting the insulation resin between the two semiconductive layers, such that the insulation resin is sandwiched between and is in direct contact with each semiconductive layer so as to form an insulation layer.

In one embodiment the invention is a process for manufacturing a multilayer article, the article comprising two crosslinked semiconductive layers separated by and bonded to an insulation layer, the semiconductive layers formed from a peroxide-crosslinkable olefin elastomer and the insulation layer comprising composition comprising a silane-grafted olefinic elastomer, the process comprising the steps of: (A) injecting the silane-grafted olefinic elastomer between the two crosslinked semiconductive layers so as to have direct contact with each semiconductive layer, and (B) crosslinking the silane-grafted olefinic elastomer in the absence of a peroxide catalyst.

In one embodiment the insulation layer comprises a polyfunctional organopolysiloxane with functional end groups. In one embodiment, the hydroxyl terminated silicone in the insulation layer reacts with an alkoxy silane grafted to a polyolefin that is in the insulation layer.

DETAILED DESCRIPTION OF THE PREFERRED EMBODIMENT

Definitions

Unless stated to the contrary, implicit from the context, or customary in the art, all parts and percents are based on weight and all test methods are current as of the filing date of this disclosure. For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, molecular weight, is from 100 to 1,000, then all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, the amount of various components of the composition, the parameters of the process, and the like.

"Comprising", "including", "having" and like terms are not intended to exclude the presence of any additional component, step or procedure, whether or not the same is specifically disclosed. In order to avoid any doubt, all processes claimed through use of the term "comprising" may include one or more additional steps, pieces of equipment or component parts, and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

"Composition", "formulation" and like terms means a mixture or blend of two or more components. In the context of a mix or blend of materials from which a layer of a flexible, multilayer article is fabricated, the composition includes all the components from which the layer is made, e.g., polymer, filler, antioxidants, flame retardants and the like.

"Polymer" and like terms means a compound prepared by polymerizing monomers, whether of the same or a different type. The generic term polymer thus embraces the term homopolymer, usually employed to refer to polymers prepared from only one type of monomer, and the term interpolymer as defined below.

"Interpolymer" means a polymer prepared by the polymerization of at least two different types of monomers. This generic term includes copolymers, usually employed to refer to polymers prepared from two different types of monomers, and polymers prepared from more than two different types of monomers, e.g., terpolymers, tetrapolymers, etc.

"Olefin polymer" and like terms mean a polymer containing, in polymerized form, a majority weight percent of an olefin, for example ethylene or propylene, etc., based on the total weight of the polymer. Nonlimiting examples of olefin-based polymers include ethylene-based polymers and propylene-based polymers.

"Elastomer", "elastomeric polymer" and the like terms means a rubber-like polymer which can be stretched to at least twice its original length and which retracts very rapidly to approximately its original length when the force exerting the stretching is released. An elastomer typically has an elastic modulus of 10,000 psi (68.95 MPa) or less and an elongation typically greater than 200% in the uncrosslinked state at room temperature as measured by ASTM D638-72.

"Olefin elastomer" and like terms mean an elastomeric polymer comprising at least 50 mole percent (mol %) of units derived from one or more olefins.

"Scrap" and like terms mean material lost during the molding process, i.e., material that becomes unusable due to substantial cross-linking which renders the compound non-moldable. This could be material which is purged in between part molding after residing at process temperature in the pumping extruder chamber while a part is being molded, but also more importantly defective parts which cannot be recycled back into the molding process. These are parts that fail during the de-molding process because of inadequate cure.

"Ambient conditions" means temperature, pressure and humidity of the surrounding area or environment of an article. For purposes of this invention, typical ambient conditions include a temperature of 23° C. and atmospheric pressure.

Overview

Non-peroxide based crosslinking technology is used in the practice of this invention, particularly for the manufacture of thick molded articles such as those used in electrical accessories. Silane-grafted olefinic elastomers modified with silanol-terminated polydimethylsiloxanes are used. The approach of this invention does not require a high-temperature cure step, but rather produces these articles via thermoplastic molding in which the mold is not heated as in the conventional manufacturing process. This is especially applicable to the insulation layer which is generally but not necessarily the thickest of the layers thus, for peroxide-based compounds, it takes the longest time to cure in the mold. The technology of this invention offers significant advantages on cycle time reduction, i.e. higher productivity, but also energy efficiency and manufacturing ergonomics as the mold need only to be maintained close to room temperature, or even lower for faster part cooling.

In one embodiment the insulation and semi-conductive layers are fully bonded to one another, i.e. failure as measured by a peel test is cohesive rather than adhesive. Adhesive failure happens at the interface of two adjacent layers, i.e., the two original layers peel apart from each other in a more or less clean fashion due to de-bonding at the interface. Cohesive failure occurs when one or both layers break at a location other than the interface between the two layers, i.e., the bond between the two layers is not the weak point in the system. In one embodiment the adhesion results in a peel force test (½ inch strip) strength of greater than (>) 0.2, or >0.5, or >1, pound-force (lbF). In one embodiment the bond or adhesion between the insulation layer and at least one, preferably both, semiconductive layers is cohesive.

Semiconductive Layers

The inner and outer (or first and second) semiconductive layers are comprised of flexible semiconductive compounds which are peroxide crosslinkable, for example, olefin elastomers such as EPDM, ethylene propylene rubber (EPR), and silicone elastomers. The first and second semiconductive layers can be compositionally the same or different. The semiconductive layers may comprise more than one layer and the layers need not be identical in composition. Alternative crosslinking of the semiconductive layers can occur by moisture cure or irradiation.

In one embodiment at least one of the semiconductive layers comprises an olefin elastomer such as a polyolefin homopolymer or interpolymer. Examples of polyolefin homopolymers are the homopolymers of ethylene and propylene. Examples of the polyolefin interpolymers are the ethylene/$\alpha$-olefin interpolymers and the propylene/$\alpha$-olefin interpolymers. The $\alpha$-olefin is preferably a $C_{3-20}$ linear, branched or cyclic $\alpha$-olefin (for the propylene/$\alpha$-olefin interpolymers, ethylene is considered an $\alpha$-olefin). Examples of $C_{3-20}$ $\alpha$-olefins include propene, 1-butene, 4-methyl-1-pentene, 1-hexene, 1-octene, 1-decene, 1-dodecene, 1-tetradecene, 1-hexadecene, and 1-octadecene. The $\alpha$-olefins can also contain a cyclic structure such as cyclohexane or cyclopentane, resulting in an $\alpha$-olefin such as 3-cyclohexyl-1-propene (allyl cyclohexane) and vinyl cyclohexane. Although not $\alpha$-olefins in the classical sense of the term, for purposes of this invention certain cyclic olefins, such as norbornene and related olefins, are $\alpha$-olefins and can be used in place of some or all of the $\alpha$-olefins described above. Similarly, styrene and its related olefins (for example, $\alpha$-methylstyrene, etc.) are $\alpha$-olefins for purposes of this invention. Illustrative polyolefin copolymers include ethylene/propylene, ethylene/butene, ethylene/1-hexene, ethylene/1-octene, ethylene/styrene, and the like. Illustrative terpolymers include ethylene/propylene/1-octene, ethylene/propylene/butene, ethylene/butene/1-octene, and ethylene/butene/styrene. The copolymers can be random or blocky.

In one embodiment the olefin elastomer can also comprise one or more functional groups such as an unsaturated ester or acid, and these elastomers (polyolefins) are well known and can be prepared by conventional high-pressure techniques. The unsaturated esters can be alkyl acrylates, alkyl methacrylates, or vinyl carboxylates. The alkyl groups can have 1 to 8 carbon atoms and preferably have 1 to 4 carbon atoms. The carboxylate groups can have 2 to 8 carbon atoms and preferably have 2 to 5 carbon atoms. The portion of the copolymer attributed to the ester comonomer can be in the range of 1 up to 50 percent by weight based on the weight of the copolymer. Examples of the acrylates and methacrylates are ethyl acrylate, methyl acrylate, methyl methacrylate, t-butyl acrylate, n-butyl acrylate, n-butyl methacrylate, and 2-ethylhexyl acrylate. Examples of the vinyl carboxylates are vinyl acetate, vinyl propionate, and vinyl butanoate. Examples of the unsaturated acids include acrylic acids or maleic acids.

Functional groups can also be included in the olefin elastomer through grafting which can be accomplished as is commonly known in the art. In one embodiment, grafting may occur by way of free radical functionalization which typically includes melt blending an olefin polymer, a free radical initiator (such as a peroxide or the like), and a compound containing a functional group. During melt blending, the free radical initiator reacts (reactive melt blending) with the olefin polymer to form polymer radicals. The compound containing a functional group bonds to the backbone of the polymer radicals to form a functionalized polymer. Exemplary compounds containing functional groups include but are not limited to alkoxysilanes, e.g., vinyl trimethoxysilane, vinyl triethoxysilane, and vinyl carboxylic acids and anhydrides, e.g., maleic anhydride.

More specific examples of olefin elastomers useful in this invention include very low density polyethylene (VLDPE) (e.g., FLEXOMER® ethylene/1-hexene polyethylene made by The Dow Chemical Company), homogeneously branched, linear ethylene/α-olefin copolymers (e.g. TAFMER® by Mitsui Petrochemicals Company Limited and EXACT® by Exxon Chemical Company), homogeneously branched, substantially linear ethylene/α-olefin polymers (e.g., AFFINITY® and ENGAGE® polyethylene available from The Dow Chemical Company), and olefin block copolymers such as those described in U.S. Pat. No. 7,355,089 (e.g., INFUSE® available from The Dow Chemical Company). The more preferred polyolefin copolymers are the homogeneously branched linear and substantially linear ethylene copolymers. The substantially linear ethylene copolymers are especially preferred, and are more fully described in U.S. Pat. Nos. 5,272,236, 5,278,272 and 5,986,028.

The olefin elastomers useful in the practice of this invention also include propylene, butene and other alkene-based copolymers, e.g., copolymers comprising a majority of units derived from propylene and a minority of units derived from another α-olefin (including ethylene). Exemplary propylene polymers useful in the practice of this invention include the VERSIFY® polymers available from The Dow Chemical Company, and the VISTAMAXX® polymers available from ExxonMobil Chemical Company.

Blends of any of the above olefinic elastomers can also be used in this invention, and the olefin elastomers can be blended or diluted with one or more other polymers to the extent that, in a preferred mode, the olefin elastomers of this invention constitute at least about 50, preferably at least about 75 and more preferably at least about 80, weight percent of the thermoplastic polymer component of the blend and retain their flexibility. In a less preferred mode and depending on other properties that may be sought, the olefin elastomer content may be less than 50% of the thermoplastic polymer component.

The olefin elastomers, particularly the ethylene elastomers, useful in the practice of this invention typically have, before grafting, a density of less than 0.91, preferably less than 0.90, grams per cubic centimeter (g/cm$^3$). The ethylene copolymers typically have a density greater than 0.85, preferably greater than 0.86, g/cm$^3$. Density is measured by the procedure of ASTM D-792. Generally, the greater the α-olefin content of the interpolymer, the lower the density and the more amorphous the interpolymer. Low density polyolefin copolymers are generally characterized as semi-crystalline, flexible and having good optical properties, e.g., high transmission of visible and UV-light and low haze.

The ethylene elastomers useful in the practice of this invention typically have, before grafting, a melt index greater than 0.10 and preferably greater than 1 gram per 10 minutes (g/10 min). The ethylene elastomers typically have a melt index of less than 500 and preferably of less than 100, g/10 min. Melt index is measured by the procedure of ASTM D-1238 (190° C./2.16 kg).

The olefin elastomer is typically used in amounts ranging from 10 to 90 wt % based on the weight of the semiconductive composition. Preferably, the olefin elastomer is used in an amount ranging from 20 to 80, more preferably from 25 to 50, wt % based on the weight of the composition.

Non-olefin elastomers useful in the manufacture of the semiconductive layers used practice of this invention include the silicone and urethane elastomers, styrene-butadiene rubber (SBR), nitrile rubber, chloroprene, fluoroelastomers, perfluoroelastomers, polyether block amides and chlorosulfonated polyethylene. The silicone elastomers are polyorganosiloxanes typically have an average unit formula $R_a SiO_{(4-a)/2}$ which may have a linear or partially-branched structure but is preferably linear. Each R may be the same or different. R is a substituted or non-substituted monovalent hydrocarbon group which may be, for example, an alkyl group, such as a methyl, ethyl, propyl, butyl, and octyl groups; aryl groups such as phenyl and tolyl groups; aralkyl groups; alkenyl groups, for example, vinyl, allyl, butenyl, hexenyl, and heptenyl groups; and halogenated alkyl groups, for example chloropropyl and 3,3,3-trifluoropropyl groups. The polyorganosiloxane may be-terminated by any of the above groups or with hydroxyl groups. When R is an alkenyl group the alkenyl group is preferably a vinyl group or hexenyl group. Indeed alkenyl groups may be present in the polyorganosiloxane on terminal groups and/or polymer side chains.

Representative silicone rubbers or polyorganosiloxanes include, but are not limited to, dimethylvinylsiloxy-terminated polydimethylsiloxane, trimethylsiloxy-terminated polydimethylsiloxane, trimethylsiloxy-terminated copolymer of methylvinylsiloxane and dimethylsiloxane, dimethylvinylsiloxy-terminated copolymer of methylvinylsiloxane and dimethylsiloxane, dimethylhydroxysiloxy-terminated polydimethylsiloxane, dimethylhydroxysiloxy-terminated copolymer of methylvinylsiloxane and dimethylsiloxane, methylvinylhydroxysiloxy-terminated copolymer of methylvinylsiloxane and dimethylsiloxane, dimethylhexenylsiloxy-terminated polydimethylsiloxane, trimethylsiloxy-terminated copolymer of methylhexenylsiloxane and dimethylsiloxane, dimethylhexenylsiloxy-terminated copolymer of methylhexenylsiloxane and dimethylsiloxane, dimethylvinylsiloxy-terminated copolymer of methylphenylsiloxane and dimethylsiloxane, dimethylhexenylsiloxy-terminated copolymer of methylphenylsiloxane and dimethylsiloxane, dimethylvinylsiloxy-terminated copolymer of methyl(3,3,3-trifluoropropyl)siloxane and dimethylsiloxane, and dimethylhexenylsiloxy-terminated copolymer of methyl (3,3,3-trifluoropropyl)siloxane and dimethylsiloxane.

The urethane elastomers are prepared from reactive polymers such as polyethers and polyesters and isocyanate functional organic compounds. One typical example is the reaction product of a dihydroxy functional polyether and/or a trihydroxy functional polyether with toluene diisocyanate such that all of the hydroxy is reacted to form urethane linkages leaving isocyanate groups for further reaction. This type of reaction product is termed a prepolymer which may cure by itself on exposure to moisture or by the stoichiometric addition of polycarbinols or other polyfunctional reactive materials which react with isocyanates. The urethane elastomers are commercially prepared having various ratios of isocyanate compounds and polyethers or polyesters.

The most common of the urethane elastomers are those containing hydroxyl functional polyethers or polyesters and, low molecular weight polyfunctional, polymeric isocyanates. Another common material for use with hydroxyl functional polyethers and polyesters is toluene diisocyanate.

Nonlimiting examples of suitable urethane rubbers include the PELLETHANE™ thermoplastic polyurethane elastomers available from the Lubrizol Corporation; ESTANE™ thermoplastic polyurethanes, TECOFLEX™ thermoplastic polyurethanes, CARBOTHANE™ thermoplastic polyurethanes, TECOPHILIC™ thermoplastic polyurethanes, TECOPLAST™ thermoplastic polyurethanes, and TECOTHANE™ thermoplastic polyurethanes, all available from Noveon; ELASTOLLAN™ thermoplastic polyurethanes and other thermoplastic polyurethanes available from BASF; and additional thermoplastic polyurethane materials available from Bayer, Huntsman, Lubrizol Corporation, Merquinsa and other suppliers. Preferred urethane rubbers are those so-called "millable" urethanes such as MILLATHANE™ grades from TSI Industries.

Additional information on such urethane materials can be found in Golding, Polymers and Resins, Van Nostrande, 1959, pages 325 et seq. and Saunders and Frisch, Polyurethanes, Chemistry and Technology, Part II, Interscience Publishers, 1964, among others.

The silicone and urethane rubbers can be used alone or in combination with one another, and are typically used in amounts ranging from 90 to 10 wt % based on the weight of the composition. Preferably, the rubbers are used in an amount ranging from 80 to 20, more preferably from 50 to 75, wt % based on the weight of the composition.

The semiconductive layers can be pre-molded or extruded in a separate step and crosslinked to achieve peak properties. The need to have residual peroxide for layer adhesion in this invention is eliminated, allowing more flexibility in part manufacturing and reducing the amount of scrap. This is partly due to the fact that adequate properties are only achieved when an appropriate cure level is reached so as to avoid part failure during de-molding. Mitigation of this problem by the use of excess peroxide is not required by this invention.

The semiconductive layers may be modified by the addition of one or more alkoxy-silanes. Any silane that will effectively copolymerize with ethylene, or graft to and crosslink an ethylene polymer, can be used in the practice of this invention, and those described by the following formula are exemplary:

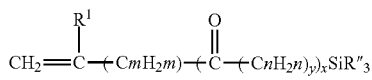

in which $R^1$ is a hydrogen atom or methyl group; x and y are 0 or 1 with the proviso that when x is 1, y is 1; m and n are independently an integer from 1 to 12 inclusive, preferably 1 to 4, and each R" independently is a hydrolyzable organic group such as an alkoxy group having from 1 to 12 carbon atoms (e.g. methoxy, ethoxy, butoxy), aryloxy group (e.g. phenoxy), araloxy group (e.g. benzyloxy), aliphatic acyloxy group having from 1 to 12 carbon atoms (e.g. formyloxy, acetyloxy, propanoyloxy), amino or substituted amino groups (alkylamino, arylamino), or a lower alkyl group having 1 to 6 carbon atoms inclusive, with the proviso that not more than one of the three R groups is an alkyl. Such silanes may be copolymerized with ethylene in a reactor, such as a high pressure process. Such silanes may also be grafted to a suitable ethylene polymer by the use of a suitable quantity of organic peroxide, either before or during a shaping or molding operation. Additional ingredients such as heat and light stabilizers, pigments, etc., also may be included in the formulation. The phase of the process during which the crosslinks are created is commonly referred to as the "cure phase" and the process itself is commonly referred to as "curing". Also included are silanes that add to unsaturation in the polymer via free radical processes such as mercaptopropyl trialkoxysilane.

Suitable silanes include unsaturated silanes that comprise an ethylenically unsaturated hydrocarbyl group, such as a vinyl, allyl, isopropenyl, butenyl, cyclohexenyl or gamma-(meth)acryloxy allyl group, and a hydrolyzable group, such as, for example, a hydrocarbyloxy, hydrocarbonyloxy, or hydrocarbylamino group. Examples of hydrolyzable groups include methoxy, ethoxy, formyloxy, acetoxy, proprionyloxy, and alkyl or arylamino groups. Preferred silanes are the unsaturated alkoxy silanes which can be grafted onto the polymer or copolymerized in-reactor with other monomers (such as ethylene and acrylates). These silanes and their method of preparation are more fully described in U.S. Pat. No. 5,266,627 to Meverden, et al. Vinyl trimethoxy silane (VTMS), vinyl triethoxy silane, vinyl triacetoxy silane, gamma-(meth) acryloxy propyl trimethoxy silane and mixtures of these silanes are the preferred silane crosslinkers for use in this invention. If filler is present, then preferably the crosslinker includes vinyl trialkoxy silane.

The amount of silane crosslinker used in the practice of this invention can vary widely depending upon the nature of the polymer, the silane, the processing or reactor conditions, the grafting or copolymerization efficiency, the ultimate application, and similar factors, but typically at least 0.5, preferably at least 0.7, weight percent is used. Considerations of convenience and economy are two of the principal limitations on the maximum amount of silane crosslinker used in the practice of this invention, and typically the maximum amount of silane crosslinker does not exceed 5, preferably it does not exceed 3, weight percent.

The silane crosslinker is grafted to the polymer by any conventional method, typically in the presence of a free radical initiator, e.g. peroxides and azo compounds, or by ionizing radiation, etc. Organic initiators are preferred, such as any one of the peroxide initiators, for example, dicumyl peroxide, di-tert-butyl peroxide, t-butyl perbenzoate, benzoyl peroxide, cumene hydroperoxide, t-butyl peroctoate, methyl ethyl ketone peroxide, 2,5-dimethyl-2,5-di(t-butyl peroxy)hexane, lauryl peroxide, and tert-butyl peracetate. A suitable azo compound is 2,2-azobisisobutyronitrile. The amount of initiator can vary, but it is typically present in an amount of at least 0.04, preferably at least 0.06, parts per hundred resin (phr). Typically, the initiator does not exceed 0.15, preferably it does not exceed about 0.10, phr. The weight ratio of silane crosslinker to initiator also can vary widely, but the typical crosslinker:initiator weight ratio is between 10:1 to 500:1, preferably between 18:1 and 250:1. As used in parts per hundred resin or phr, "resin" means the olefinic polymer.

While any conventional method can be used to graft the silane crosslinker to the polyolefin polymer, one preferred method is blending the two with the initiator in the first stage of a reactor extruder, such as a Buss kneader. The grafting conditions can vary, but the melt temperatures are typically between 160 and 260° C., preferably between 190 and 230° C., depending upon the residence time and the half life of the initiator.

Copolymerization of vinyl trialkoxysilane crosslinkers with ethylene and other monomers may be done in a high-pressure reactor that is used in the manufacture of ethylene homopolymers and copolymers with vinyl acetate and acrylates.

The oligomers containing functional end groups useful in the present process comprise from 2 to 100,000 or more units of the formula $R_2SiO$ in which each R is independently selected from a group consisting of alkyl radicals comprising one to 12 carbon atoms, alkenyl radicals comprising two to about 12 carbon atoms, aryls, and fluorine substituted alkyl radicals comprising one to about 12 carbon atoms. The radical R can be, for example, methyl, ethyl, n-propyl, isopropyl, n-butyl, sec-butyl, dodecyl, vinyl, allyl, phenyl, naphthyl, tolyl, and 3,3,3-trifluoropropyl. Preferred is when each radical R is methyl.

In one embodiment, the organopolysiloxane containing one or more functional end groups is a hydroxyl-terminated polydimethylsiloxane containing at least two hydroxyl end groups. Such polydimethylsiloxanes are commercially available, for example as silanol-terminated polydimethylsiloxane from Gelest, Inc. However, polydimethylsiloxanes having other terminal groups that can react with grafted silanes may be used e.g. polydimethylsiloxanes with amine end groups and the like. In addition, the polysiloxane may be a moisture-crosslinkable polysiloxane. In preferred embodiments, the polydimethylsiloxane is of the formula

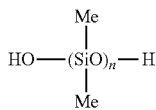

in which Me is methyl and n is in the range of 2 to 100,000 or more, preferably in the range of 10 to 400 and more preferably in the range of 20 to 120. Examples of suitable polyfunctional organopolysiloxanes are the silanol-terminated polydimethylsiloxane DMS-15 (Mn of 2,000-3,500, viscosity of 45-85 centistokes, —OH level of 0.9-1.2%) from Gelest Corp., and Silanol Fluid 1-3563 (viscosity 55-90 centistokes, —OH level of 1-1.7%) from Dow Corning Corp. In some embodiments the polyfunctional organopolysiloxane comprises branches such as those imparted by Me-$SiO_{3/2}$ or $SiO_{4/2}$ groups (known as Tor Q groups to those skilled in silicone chemistry).

The amount of polyfunctional organopolysiloxane used in the practice of this invention can vary widely depending upon the nature of the polymer, the silane, the polyfunctional organopolysiloxane, the processing or reactor conditions, the ultimate application, and similar factors, but typically at least 0.5, preferably at least 2, weight percent is used. Considerations of convenience and economy are two of the principal limitations on the maximum amount of polyfunctional organopolysiloxane used in the practice of this invention, and typically the maximum amount of polyfunctional organopolysiloxane does not exceed 20, preferably it does not exceed 10, weight percent.

Crosslinking catalysts include the Lewis and Brønsted acids and bases. Lewis acids are chemical species that can accept an electron pair from a Lewis base. Lewis bases are chemical species that can donate an electron pair to a Lewis acid. Lewis acids that can be used in the practice of this invention include the tin carboxylates such as dibutyl tin dilaurate (DBTDL), dimethyl hydroxy tin oleate, dioctyl tin maleate, di-n-butyl tin maleate, dibutyl tin diacetate, dibutyl tin dioctoate, stannous acetate, stannous octoate, and various other organo-metal compounds such as lead naphthenate, zinc caprylate and cobalt naphthenate. DBTDL is a preferred Lewis acid. Lewis bases that can be used in the practice of this invention include, but are not limited to, the primary, secondary and tertiary amines. These catalysts are typically used in moisture cure applications.

Brønsted acids are chemical species that can lose or donate a hydrogen ion (proton) to a Brønsted base. Brønsted bases are chemical species that can gain or accept a hydrogen ion from a Brønsted acid. Brønsted acids that can be used in the practice of this invention include sulfonic acid.

The minimum amount of crosslinking catalyst used in the practice of this invention is a catalytic amount. Typically this amount is at least 0.01, preferably at least 0.02 and more preferably at least 0.03, weight percent (wt %) of the combined weight of ethylene-vinylsilane polymer and catalyst. The only limit on the maximum amount of crosslinking catalyst in the ethylene polymer is that imposed by economics and practicality (e.g., diminishing returns), but typically a general maximum comprises less than 5, preferably less than 3 and more preferably less than 2, wt % of the combined weight of ethylene polymer and condensation catalyst.

Insulation Layer

The insulation layer of this invention is made from a composition comprising an olefin polymer, typically an ethylene-based polymer that contains copolymerized silane functionality or is subsequently grafted with a silane. In one embodiment, the polyethylene is made using a high pressure process. In another embodiment, the polyethylene is made using a mono- or bis-cyclopentadienyl, indenyl, or fluorenyl transition metal (preferably Group 4) catalysts or constrained geometry catalysts (CGC) in combination with an activator, in a solution, slurry, or gas phase polymerization process. The catalyst is preferably mono-cyclopentadienyl, mono-indenyl or mono-fluorenyl CGC. The solution process is preferred. U.S. Pat. No. 5,064,802, WO93/19104 and WO95/00526 disclose constrained geometry metal complexes and methods for their preparation. Variously substituted indenyl containing metal complexes are taught in WO95/14024 and WO98/49212.

In general, polymerization can be accomplished at conditions well-known in the art for Ziegler-Natta or Kaminsky-Sinn type polymerization reactions, that is, at temperatures from 0-250° C., preferably 30-200° C., and pressures from atmospheric to 10,000 atmospheres (1013 megaPascal (MPa)). Suspension, solution, slurry, gas phase, solid state powder polymerization or other process conditions may be employed if desired. The catalyst can be supported or unsupported, and the composition of the support can vary widely. Silica, alumina or a polymer (especially poly(tetrafluoroethylene) or a polyolefin) are representative supports, and desirably a support is employed when the catalyst is used in a gas phase polymerization process. The support is preferably employed in an amount sufficient to provide a weight ratio of catalyst (based on metal) to support within a range of from 1:100,000 to 1:10, more preferably from 1:50,000 to 1:20, and most preferably from 1:10,000 to 1:30. In most polymerization reactions, the molar ratio of catalyst to polymerizable compounds employed is from 10-12:1 to 10-1:1, more preferably from $10^{-9}$:1 to $10^{-5}$:1.

The α-olefin is preferably a $C_{3-20}$ linear, branched or cyclic α-olefin. Examples of $C_{3-20}$ α-olefins include propene, 1-butene, 4-methyl-1-pentene, 1-hexene, 1-octene, 1-decene, 1-dodecene, 1-tetradecene, 1-hexadecene, and 1-octadecene.

The α-olefins also can contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, particularly 5-ethylidene-2-norbornene, are α-olefins and can be used in place of some or all of the α-olefins described above. Similarly, styrene and its related olefins (for example, α-methylstyrene, etc.) are α-olefins for purposes of this invention. Illustrative ethylene polymers include ethylene/propylene, ethylene/butene, ethylene/1-hexene, ethylene/1-octene, ethylene/styrene, and the like. Illustrative terpolymers include ethylene/propylene/1-octene, ethylene/propylene/butene, ethylene/butene/1-octene, ethylene/propylene/diene monomer (EPDM) and ethylene/butene/styrene. The copolymers can be random or blocky.

The ethylene polymers used in the manufacture of the insulation layer that is used in the practice of this invention can be used alone or in combination with one or more other ethylene polymers, e.g., a blend of two or more ethylene polymers that differ from one another by monomer composition and content, catalytic method of preparation, etc. If the ethylene polymer is a blend of two or more ethylene polymers, then the ethylene polymer can be blended by any in-reactor or post-reactor process. The in-reactor blending processes are preferred to the post-reactor blending processes, and the processes using multiple reactors connected in series are the preferred in-reactor blending processes. These reactors can be charged with the same catalyst but operated at different conditions, e.g., different reactant concentrations, temperatures, pressures, etc, or operated at the same conditions but charged with different catalysts.

Examples of ethylene polymers made with high pressure processes include (but are not limited to) low density polyethylene (LDPE), ethylene silane reactor copolymer (such as SiLINK® made by The Dow Chemical Company), ethylene vinyl acetate copolymer (EVA), ethylene ethyl acrylate copolymer (EEA), and ethylene silane acrylate terpolymers.

Examples of ethylene polymers that can be grafted with silane functionality include very low density polyethylene (VLDPE) (e.g., FLEXOMER® ethylene/1-hexene polyethylene made by The Dow Chemical Company), homogeneously branched, linear ethylene/α-olefin copolymers (e.g., TAFMER® by Mitsui Petrochemicals Company Limited and EXACT® by Exxon Chemical Company), homogeneously branched, substantially linear ethylene/α-olefin polymers (e.g., AFFINITY® and ENGAGE® polyethylene available from The Dow Chemical Company), and ethylene block copolymers (e.g., INFUSE® polyethylene available from The Dow Chemical Company). The more preferred ethylene polymers are the homogeneously branched linear and substantially linear ethylene copolymers. The substantially linear ethylene copolymers are especially preferred, and are more fully described in U.S. Pat. Nos. 5,272,236, 5,278,272 and 5,986,028.

The elastomeric polymer from which the insulation layer is made may be modified by the addition of one or more alkoxysilanes as described above for the polymers from which the semiconductive layers are made.

When the insulation material is injected between the semiconductive layers comprising the modified compound as described above, adhesion across the interface is promoted by reaction with hydroxyl terminated silicone (or grafted alkoxysilane) in the insulation layers.

Alternatively, if the compositions from which the semiconductive layers are prepared comprise a urethane compound, then the insulation layer can be prepared from a composition that comprises an aminated olefin polymer to promote adhesion. This polymer may be made by the reaction of a diamine that has both a primary and secondary amine, with a maleated polyolefin, e.g., AMPLIFY™ GR.

Molding Process for Producing a Multilayer Article

The process of this invention produces a multilayer article of chosen design by injecting an elastomeric compound between two crosslinked semiconductive layers to form an insulation layer that is bonded, preferably cohesively bonded, to at least one, preferably to both, semiconductive layers. The insulation layer does not necessarily need curing during the manufacturing step and can be made of a low melting point elastomer to enable a low temperature injection and rapid cooling for fast removal from the mold. In one embodiment, the semiconductive layers comprising a vinyl-alkoxy silane are individually peroxide crosslinked during molding, prior to their contact with an insulation layer. In a subsequent step, a compound comprising a silane-grafted olefin elastomer and hydroxy-terminated silicone is injected between the crosslinked inner and outer semiconductive layers to form an insulation layer between and adhesively, preferably cohesively, bonded to each of the semiconductive layers. During off mold cure of the insulation layer, interfacial crosslinking between insulation and semiconductive layers is achieved.

Generally, for a medium voltage part, the insulation layer is thicker than the semiconductive layers individually across most of the part. However, the insulation thickness is not uniform within a given part design and may taper to less than 1 mm at the end of the part to more 12 mm at the center of part. Low voltage parts would be thinner and high voltage parts would be thicker.

The compositions from which the semiconductive and insulation layers of this invention are made can also contain additives such as, for example, antioxidants (e.g., hindered phenols such as, for example, IRGANOX™ 1010 a registered trademark of Ciba Specialty Chemicals), phosphites (e.g., IRGAFOS™ 168 a registered trademark of Ciba Specialty Chemicals), UV stabilizers, cling additives, light stabilizers (such as hindered amines), plasticizers (such as dioctylphthalate or epoxidized soy bean oil), scorch inhibitors, mold release agents, tackifiers (such as hydrocarbon tackifiers), waxes (such as polyethylene waxes), processing aids (such as oils, organic acids such as stearic acid, metal salts of organic acids), oil extenders (such as paraffin oil and mineral oil), colorants or pigments to the extent that they do not interfere with desired physical or mechanical properties of the compositions of the present invention. These additives are used in amounts known to those versed in the art.

Several methods can be used in manufacturing a part such as those described in U.S. Pat. Nos. 6,796,820 and 6,905,356. One convenient approach is to mold the inner and outer semiconductive layers in a separate step, mount the inner layer on a metal core to hold it in place, and then mount onto it the outer layers. The assembly thus made is fitted in another mold so as both the outer and inner layer are positioned in a secured fashion to maintain the gap in between. The insulation compound is then injected from a passage pre-made in the outer layer, the material flows all around and fills the gap to make a finished part.

Specific Embodiments

Semiconductive Layers

The composition of the semiconductive layers is described in Table 1.

TABLE 1

Composition of Semiconductive Layers

Semiconductive Compound A

| | |
|---|---|
| Nordell IP 3430 | 34.60 |
| Dow Corning GP 130-25 | 33.50 |
| XC-500 carbon black | 22.30 |
| Zinc Oxide | 2.00 |
| Sunpar 2280 (oil) | 7.60 |
| Total | 100.00 |

Peroxide added in a second step

| | |
|---|---|
| Perkadox 14S FL | 1.00% |
| Perkadox BC FF | 1.00% |

Laboratory scale samples of the semiconductive compound shown in Table 1 are produced as follows. The compounds are made using a 250 cc Brabender batch mixer. The mixer is initially set at 120° C. and a rotor speed of 35 revolutions per minute (rpm). First, the polymer resins are loaded into the mixer, and then the carbon black is added slowly and mixed for 15 minutes. Whenever possible, polyolefin and/or hydrocarbon rubber are added first, then carbon black, then non-polyolefin rubber, but this may not always be possible as some compositions make this impractical to fill the mixer. In no case, however, is a masterbatch made for later addition of the non-olefin rubber. Depending on the level of carbon black and the resin type, melt temperatures ranges from 130 to 140° C. at the end of the mixing cycle. In some cases it is possible to cool the material in the mixer without removal; in other cases it is necessary to remove the compound from the mixer for cooling purposes prior to peroxide addition. In such cases, the material is re-loaded for peroxide addition. In all cases, after peroxide is added, the mixture is compounded for additional 10 minutes at 35 rpm to incorporate the peroxide while ensuring the compound temperature remains below 125° C. to prevent premature crosslinking. The compound thus prepared is compression molded into 75 mil plaques which are cured in the press (Wabash Model #30-1212-451-4ST MBX) under the indicated cure conditions of time and temperature. Optionally, prior to molding, the compound may also be roll-milled at a temperature less than 100° C. for further homogenization as is practice in the art.

Compression molding presses the semiconductive layers into plaques and cures as described in Table 4.

Insulation Layer

One embodiment of the composition of the insulation layer is described in Table 2.

TABLE 2

Composition of the Insulation Layer

Insulation Compound B

| | |
|---|---|
| ENGAGE 8200 | 45.49 |
| ENGAGE 7467 | 45.49 |
| PDMS Q-3563 | 5.00 |
| VTMS | 2.00 |
| L-101 | 0.02 |
| Translink 37 | 2.00 |
| Total | 100.00 |

ENGAGE™ 8200 plastomer (an ethylene-octene copolymer) is used in the insulation material along with ENGAGE™ 7467 (an ethylene butane copolymer). The polymers are mixed with VTMS and Luperox 101 peroxide (2,5-dimethyl-2,5-di(t-butylperoxy)hexane available from Arkema), hydroxy-polydimethylsiloxane (PDMS Q1-3563), and clay (Translink®-37) is added. Insulation compound B is prepared either in Brabender lab mixer or a twin-screw compounding extruder. Insulation compound B is then compounded with 5% of the catalyst masterbatch C (Table 3) in a 250 cc Brabender at 150° C., at 35 RPM, for 10 minutes for good homogenization of the catalyst and the additives.

TABLE 3

Catalyst Composition

Masterbatch C

| | |
|---|---|
| ENGAGE 7467 | 89.30 |
| Fastcat 4202 | 1.50 |
| Irganox 1010 | 6.00 |
| Irganox 1024 | 3.20 |
| Total | 100.0 |

The catalyst composition includes antioxidants (e.g., hindered phenols of IRGANOX™ 1010 and IRGANOX™ 1024)

Catalyst masterbatch C is prepared in a ZSK-30 twin screw extruder at melt temperatures not exceeding 200° C. In this compounding step, ENGAGE resin along with the additives (IRGANOX 1010 and IRGANOX 1024) are added with resin feed and liquid catalyst Fastcat 4202 (dibutyltin dilaurate, Elf-Atochem/Arkema Corp.) is injected as a liquid into the extruder. The compound is extruded, cooled and pelletized for further use. The same compound can also be made at lab scale in a Brabender batch mixer.

Process of Producing a Multilayered Article

Insulation material B mixed with catalyst masterbatch C is then pressed against the layers made from semi-conductive compound A at 180° C. for 5 minutes to make a dual layer specimen. During pressing of the two plaques care is taken to insert a piece of a Mylar sheet within about 1 inch from the end of the layers so the plaques can be free, thus easy to hold in the peel tester. The pressed plaques sit for five days in constant temperature and humidity under ambient conditions. Specimen, 0.5 in. wide and 8 in. long, are cut for the adhesion peel test.

The plaques are then tested for adhesion. A peel force test on the pressed plaques is conducted as follows. An Instron tensile tester is used and the two layers of the specimen are opened to a 180 degree angle so each side fits in the opposite jaw of the tester. Once clamped the tester pulls one end, peeling one layer at a speed of 20 in/min, while the other is held fixed. The peeling can result in a clean delamination, or tearing of one layer, i.e. the material of which would remain bonded on the other layer, or simple breakage of one of the layers. A peel force is registered by the instrument.

TABLE 4

Adhesion Results

|  | CE-1 | CE-2 | E1 | E2 |
|---|---|---|---|---|
| Semi-Conductive Compound (200900025-45-1) | 100 | 100 | 98 | 95 |
| Vinyltrimethoxysilane (VTMS) | 0 | 0 | 2 | 2 |
| OH-PDMS (DowCorning Q 1-3563) | 0 | 0 | 0 | 3 |
| Total | 100 | 100 | 100 | 100 |
| Plaque Cure (75 mil) | 3 min, 170 C. | 12 min, 170 C. | 10 min, 170 C. | 10 min, 170 C. |
| Insulation/Semicon Layers Pressed at 180 C., 5 min | Adhesive failure | Adhesive failure | Cohesive Failure | Cohesive Failure |
| Insulation/Semicon layers Pressed at 120 C., 5 min |  |  | Cohesive Failure | Cohesive Failure |
| Peel Force (lbF) | 0.5 | 0.3 | 5.2 | 5.2 |

The inventive examples which have VTMS or VTMS/OH-PDMS in the semiconductive layer did not fail at the interface, while the comparative examples did, indicating good layer adhesion in the inventive examples. This is also clearly indicated by the peel force data. With full adhesion the magnitude of the force is really determined by how strong the material comprising the layer is itself, since the failure is a material failure rather than a bond failure.

TABLE 5

Additional Test Results

|  | Example 3 | Example 4 | Example 5 |
|---|---|---|---|
| PPLT Semicon A | 97.5 | 90 | 80 |
| VTES (A-151 or DC Z6518) | 2.5 |  |  |
| Insulation Compound B | 0 | 10 | 20 |
| Total | 100 | 100 | 100 |
| Semicon Plaque Cure (75 mil) | 10 min, 170 C. | 10 min, 170 C. | 10 min, 170 C. |
| Pressing modified semicon above against Insulation compound containing catalyst MB | 120 C., 5 min | 120 C., 5 min | 120 C., 5 min |
| Peel strength (lbf/in) | 15.8 | 5.7 | 9.4 |
| Adhesion Comment | Fully bonded, cohesive failure | Partially bonded, adhesive failure dominant | Substantially bonded, cohesive failure dominant |

Table 5 reports additional data in which in Example 3 semiconductive compound A is modified with VTES, and in Examples 4 and 5 it was modified by adding a portion of the insulation compound B (silane grafted and reacted with OH-PDMS as indicated earlier), then the insulation Compound B (containing Catalyst Masterbach C) was pressed against semiconductive compound A. As is reported in Table 5, the test specimen of Example 3 exhibits full bonding while the test specimens of Examples 4 and 5 still exhibit at least partial cohesive bonding.

Although the invention has been described with certain detail through the preceding description of the preferred embodiments, this detail is for the primary purpose of illustration. Many variations and modifications can be made by one skilled in the art without departing from the spirit and scope of the invention as described in the following claims.

What is claimed is:

1. A process for manufacturing a multilayer article, the article comprising two crosslinked semiconductive layers separated by and bonded to an insulation layer, the semiconductive layers formed from a peroxide-crosslinkable olefin elastomer and the insulation layer comprising composition comprising a silane-grafted olefinic elastomer, the process comprising the steps of: (A) injecting the silane-grafted olefinic elastomer between the two crosslinked semiconductive layers so as to have direct contact with each semiconductive layer, and (B) crosslinking the silane-grafted olefinic elastomer in the absence of a peroxide catalyst.

2. The process of claim 1 in which the silane-grafted olefinic elastomer is modified with silanol-terminated polydialkylsiloxane.

3. The process of claim 1 in which the peroxide-crosslinkable olefin elastomer is an ethylene elastomer.

4. The process of claim 1 in which the composition comprising the silane-graft olefinic elastomer further comprises a cure catalyst.

5. The process of claim 1 in which the peroxide-crosslinkable olefin elastomer is silane grafted.

6. The process of claim 1 in which the semiconductive layers are without sufficient residual peroxide to promote crosslinking of the composition from which the insulation layer is made.

7. The process of claim 1 in which the semiconductive layers are compositionally the same.

8. The process of claim 1 in which the semiconductive layers are compositionally different from one another.

9. The process of claim 1 in which the insulation layer crosslinks at ambient temperature.

10. The process of claim 1 in which the insulation layer forms a cohesive bond with at least one of the semiconductive layers.

* * * * *